United States Patent [19]

Sakai et al.

[11] Patent Number: 4,565,942
[45] Date of Patent: Jan. 21, 1986

[54] ENERGY TRAPPED PIEZOELECTRIC RESONATOR LIQUID SENSOR

[75] Inventors: Katsumi Sakai, Kanazawa; Isao Toyoshima, Ishikawa, both of Japan

[73] Assignee: Murata Manufacturing Co., Ltd., Kyoto, Japan

[21] Appl. No.: 626,123

[22] Filed: Jun. 29, 1984

[30] Foreign Application Priority Data

Jul. 1, 1983 [JP]  Japan ............................ 58-103324[U]
Jul. 1, 1983 [JP]  Japan ............................ 58-103325[U]

[51] Int. Cl.⁴ .......................................... H01L 41/08
[52] U.S. Cl. .................... 310/338; 310/320; 310/323; 310/337; 310/366; 310/340
[58] Field of Search ............... 310/311, 320, 321, 323, 310/324, 328, 337, 338, 339, 312, 366, 340; 73/290 V; 340/603, 618, 621

[56] References Cited

U.S. PATENT DOCUMENTS

| | | | |
|---|---|---|---|
| 2,814,575 | 11/1957 | Lange, Jr. ............................ | 310/340 |
| 3,110,890 | 11/1963 | Westcott et al. .................. | 73/290 V |
| 3,253,219 | 5/1966 | Littler ............................. | 310/321 X |
| 3,401,276 | 9/1968 | Curran et al. ........................ | 310/320 |
| 3,706,981 | 12/1972 | Hart ................................. | 340/621 X |
| 4,117,074 | 9/1978 | Tierstein et al. ..................... | 310/320 |
| 4,175,243 | 11/1979 | Corbett ............................ | 310/320 X |
| 4,469,976 | 9/1984 | Scott ................................ | 310/366 X |

FOREIGN PATENT DOCUMENTS

| | | | |
|---|---|---|---|
| 1027735 | 7/1956 | Fed. Rep. of Germany ...... | 310/312 |
| 0050722 | 4/1980 | Japan .................... | 310/320 |
| 0083818 | 6/1980 | Japan .................... | 73/290 V |
| 0110917 | 8/1980 | Japan .................... | 73/290 V |
| 0613213 | 6/1978 | U.S.S.R. .................. | 73/290 V |

Primary Examiner—Mark O. Budd
Attorney, Agent, or Firm—Wenderoth, Lind & Ponack

[57] ABSTRACT

A liquid sensor mounted on the side wall of a liquid tank for detecting the existence of liquid in the tank. The sensor includes an element which generates a vibration in the direction of its thickness, of energy-trapped type for detecting the existence of liquid. The element consists of electrodes provided on both sides of a piezoelectric substrate, one side of the element for contacting the liquid in the tank being covered with a liquid-proof coating. The existence of liquid is detected from the change in resonance impedance or antiresonance impedance resulting from the liquid contact.

2 Claims, 8 Drawing Figures

ENERGY TRAPPED PIEZOELECTRIC RESONATOR LIQUID SENSOR

BACKGROUND OF THE INVENTION

The present invention relates to a liquid sensor mounted on a side wall or the like of a liquid tank for detecting the existence of liquid in the tank.

An apparatus for detecting liquids, such as a liquid level indicator, in which a plurality of electrodes provided at intervals are electrically connected through a liquid when contacted with said liquid, has been known.

However, an apparatus having such a construction has such a disadvantage that it cannot be used for the detection of electrically nonconductive liquids.

Further, it has a problem of corrosion since the electrodes are exposed to liquids, that is to say, they are brought into direct contact with liquids and it is difficult to miniaturize such an apparatus.

In addition, although a detecting apparatus of the float-switch type has also been known in addition to the above described one of the electrode type, the float-switch type detecting apparatus is also difficult to miniaturize, and is subject to frequent malfunction since it contains movable parts therein.

Thus, it is a first object of the present to provide a liquid sensor which can detect even electrically nonconductive liquids independently of the kind of liquids.

It is a second object of the present invention to provide a remarkably miniaturized liquid sensor which will not to malfunction.

It is a third object of the present invention to provide a liquid sensor having electrodes which will not corrode owing to the contact with liquids thereof and can be easily electrically mounted on a liquid tank.

It is a fourth object of the present invention to provide a liquid sensor which can be easily incorporated in an electric circuit since it can be directly operated with electric signals.

BRIEF DESCRIPTION OF THE DRAWINGS

The above and other objects and features of the invention will appear more fully hereinafter from a consideration of the following description taken in connection with the accompanying drawings wherein one example is illustrated by way of example.

DETAILED DESCRIPTION OF THE PREFERRED EMBODIMENTS

Figure 1:
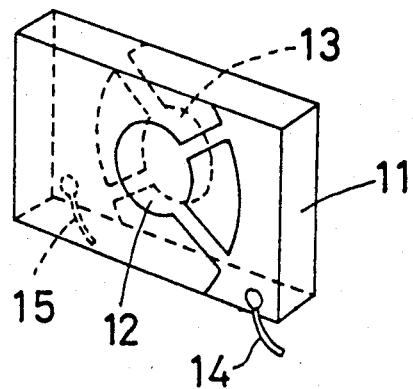
FIG. 1 is a perspective view showing a first example of a liquid sensor according to the present invention.
Figure 2:
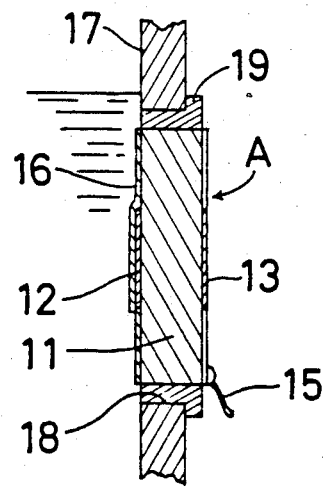
FIG. 2 is an enlarged longitudinal sectional view showing the attachment of the liquid sensor shown in FIG. 1.

Referring now to FIGS. 1 and 2 showing the first example of a liquid sensor according to the present invention, a substrate 11 made of piezo-electric ceramic plate or the like is provided with electrodes 12 and 13 such as thin silver film at the center of both one side and the reverse side thereof, lead wires 14 and 15 being soldered to terminal portions of said electrodes 12 and 13, and one of sides of said substrate 11 being coated with a liquid-proof paint 16.

Piezo-electric substrate 11 forms a thickness vibration element of energy-trapped type when the electrodes 12 and 13 are provided on both sides thereof and a liquid sensor A covered with said coating 16 is formed on one of said both sides.

Figure 3:
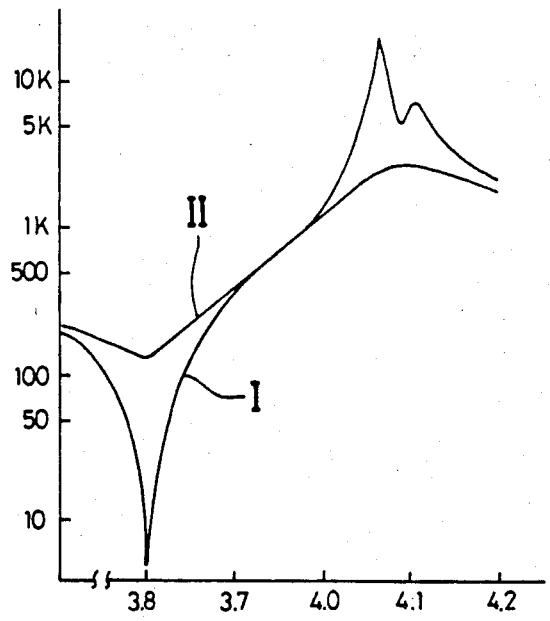
FIG. 3 is a graph showing impedance characteristics of the liquid sensor shown in FIG. 1.
Figure 4:
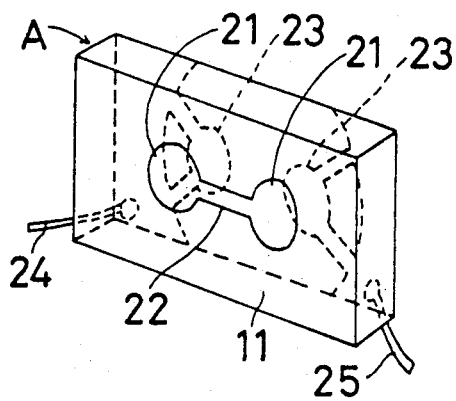
FIG. 4 is a perspective view showing a second example of a liquid sensor according to the present invention.
Figure 5:
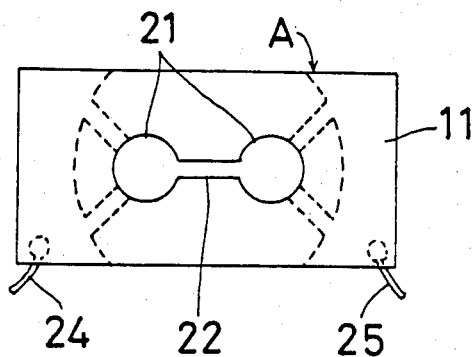
FIG. 5 is a front view of the liquid sensor shown in FIG. 4.

Referring to FIG. 2 showing the attachment of said liquid sensor A, an opening 18 is formed on a side wall 17 of a liquid tank, said liquid sensor A according to the present invention being fixedly connected with said opening 18 with a side covered with said coating 16 as the liquid (inner) side, a seal 19 made of rubber or the like being provided between said liquid sensor A and said opening 18, said lead wire 14 on the liquid side being pulled out of the side wall therethrough holding the portion thereof corresponding to said seal 19 liquid tight, said electrode 12 on the liquid side being pulled out to side of said electrode 13 (the outer side) through a hole or a notch provided in a side wall of said substrate 11 or said substrate 11, and said lead wires 14 and 15 being connected to the appointed positions of an oscillator circuit (not shown). Oscillation frequencies of about 2 to 12 MHz are selected. A liquid sensor according to the present invention has the above described construction and FIG. 3 is a graph showing the impedance characteristics of such a liquid sensor.

In this graph, an axis of ordinates shows impedance while an axis of abscissas shows frequency. The curve I shows the initial characteristics when the liquid sensor is not brought into contact with liquid while the curve II shows the characteristics when the liquid sensor is brought into contact with liquid. When a liquid sensor is brought into contact with liquid, resonance resistance is increased or antiresonance resistance is reduced to stop the oscillation, whereby the existence of liquid can be detected.

A second example shown in FIGS. 4 to 8 will now be described. According to this second example, it is not required to wire to the side for contacting with liquid and the seal construction in attachment of the device to the side wall of the tank can be simplified. The same parts as in the first example shown in FIGS. 1 and 2 will be described using the same reference numerals used in describing the first example.

As illustrated in the drawings, said piezo-electric substrate 11 is provided with a pair of suitably spaced electrodes, 21 made of thin silver film or the like arranged on the surface thereof, both electrodes 21 being connected with each other through a connecting member 22 made of the same materials as themselves. Numeral 23 designate two pieces of electrodes made of thin silver film and the like provided for the rear portions of the electrodes 21 on the surface face to face, and lead wires 24 and 25 are soldered to the terminals of said electrodes 23.

In addition, the liquid facing surface of said substrate 11 is covered with a coating 16 formed from liquid-proof paint to form a liquid sensor A.

Figure 7:
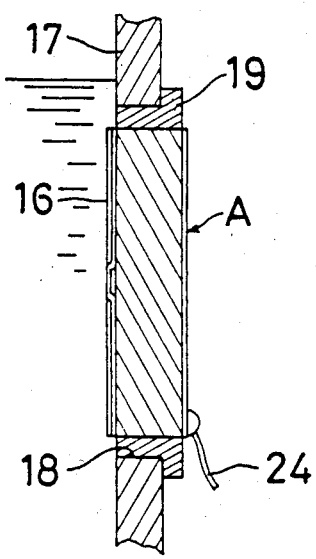
FIG. 7 is an enlarged longitudinal sectional view of the attachment of the liquid sensor shown in FIG. 4.
Figure 6:
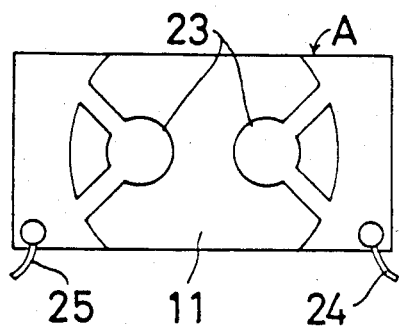
FIG. 6 is a back view of the liquid sensor shown in FIG. 4.

Referring to FIG. 7 showing the attachment of said liquid sensor A, an opening 18 is formed on a side wall 17 of a liquid tank, said liquid sensor A according to the present invention being fixedly connected with said opening 18 with said substrate 11 covered with said coating 16 on the liquid side and the reverse side of said substrate 11 provided with said lead wires 24 and 25 exposed to the outside of the tank, a seal 19 made of rubber or the like being provided between said liquid sensor A and said opening 18, and said lead wires 24 and 25 being connected to the appointed positions of a transmission circuit (not shown). Oscillation frequencies of about 2 to 12 MHz are selected.

Figure 8:
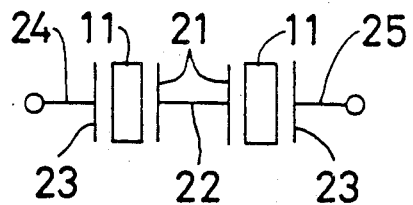
FIG. 8 is an equivalent circuit of the liquid sensor shown in FIG. 4.

FIG. 8 is an equivalent circuit of such a piezo-electric sensor A. This piezo-electric sensor A acts as a single vibration element. As soon as a liquid level in a liquid tank is raised and liquid is brought into contact with the surface of said sensor A, the resonance resistance is increased and the oscillation resonance resistance is reduced to stop the transmission, thereby being capable of detecting a liquid level.

As described above, there is not the possibility that a liquid sensor according to the present invention mechanically malfunctions since it has no movable parts. Since it is remarkably miniaturized and light, it can be easily mounted. It has an advantage that it can be easily incorporated in an electric circuit since it can be directly operated with electric signals. Further, in the second example, since all of electrodes connecting with an electric circuit are provided on the reverse (outer) side of a substrate, it is not required to pass lead wires through the side wall of a liquid tank in the attachment to a liquid tank thereby being capable of being very easily mounted.

What is claimed is:

1. A liquid sensor, comprising:
   a piezoelectric substrate having a first planar side for contacting a liquid, and a second planar side opposite said first side, bounded by a periphery, mountable on a wall on said periphery;
   at least one first electrode located on said first side and at least one second electrode located on said second side so that said substrate vibrates in the direction extending between said first and second sides in an energy-trapped manner in response to electric excitation applied across said at least one first electrode and said at least one second electrode when said substrate is mounted at said periphery to a wall, said substrate, said at least one first electrode and said at least one second electrode thereby defining an energy-trapped type resonant element; and
   a liquid-proof coating covering said first side including the at least one first electrode.

2. A liquid sensor as in claim 1, wherein said at least one first electrode comprises a first pair of spaced apart electrically connected electrodes on said first side and said at least one second electrode comprises a second pair of electrically separated electrodes on said second side, opposing respective ones of said first pair of electrodes, said sensor further comprising first and second terminals on said second side electrically connected to respective ones of said second pair of electrodes, whereby said substrate can be vibrated by applying an electrical excitation across said first and second terminals.

* * * * *